US009105719B2

(12) United States Patent
Ito

(10) Patent No.: US 9,105,719 B2
(45) Date of Patent: Aug. 11, 2015

(54) MULTIGATE METAL OXIDE SEMICONDUCTOR DEVICES AND FABRICATION METHODS

(71) Applicant: Broadcom Corporation, Irvine, CA (US)

(72) Inventor: Akira Ito, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 43 days.

(21) Appl. No.: 13/737,682

(22) Filed: Jan. 9, 2013

(65) Prior Publication Data

US 2014/0191315 A1 Jul. 10, 2014

(51) Int. Cl.
*H01L 29/78* (2006.01)
*H01L 29/66* (2006.01)

(52) U.S. Cl.
CPC ...... *H01L 29/7831* (2013.01); *H01L 29/66484* (2013.01); *H01L 29/785* (2013.01); *H01L 29/7833* (2013.01)

(58) Field of Classification Search
CPC ..................... H01L 29/41791; H01L 29/7855; H01L 29/7856
USPC .......................................................... 257/366
See application file for complete search history.

(56) References Cited

U.S. PATENT DOCUMENTS

| 8,053,846 | B2 | 11/2011 | Cha et al. | |
|---|---|---|---|---|
| 2006/0244079 | A1 | 11/2006 | Wang et al. | |
| 2009/0309162 | A1* | 12/2009 | Baumgartner et al. | 257/368 |
| 2010/0237436 | A1* | 9/2010 | Inaba | 257/401 |

OTHER PUBLICATIONS

Kanemura, T., et al. "*Improvement of Drive Current in Bulk-FinFET Using Full 3D Process/Device Simulations*", SISPAD IEEE, 2006, (4p).
Office Action from Taiwan Appln. No. 103100444, dated May 25, 2015, 4p.

* cited by examiner

*Primary Examiner* — Chandra Chaudhari
(74) *Attorney, Agent, or Firm* — Brinks Gilson & Lione

(57) ABSTRACT

A semiconductor device includes a first well and a second well implanted in a semiconductor substrate. The semiconductor device further includes a gate structure above the first and second wells between a raised source structure and a raised drain structure. The raised source structure above is in contact with the first well and connected with the gate structure through a first semiconductor fin structure. The raised drain structure above and in contact with the second well and connected with a second semiconductor fin structure. The second semiconductor fin structure includes at least a gap and a lightly doped portion.

20 Claims, 7 Drawing Sheets

MULTIGATE METAL OXIDE SEMICONDUCTOR DEVICES AND FABRICATION METHODS

TECHNICAL FIELD

This disclosure relates generally to a metal oxide semiconductor field effect transistor (MOSFET). More particularly, it relates to fabrication methods and device structures related to multigate laterally diffused metal oxide semiconductor (LDMOS).

BACKGROUND

Silicon semiconductor processing has evolved sophisticated operations for fabricating integrated circuits. As advancement in fabrication process technology continues, the core and Input/Output (I/O) operating voltages of integrated circuits have decreased. However, operating voltages of auxiliary devices have remained about the same. The auxiliary devices include devices interfaced to the integrated circuits. For example, the auxiliary devices may be printers, scanners, disk drives, tape drives, microphones, speakers, or cameras.

An integrated circuit may include an interconnected array of active and passive elements, such as transistors, resistors, capacitors, and inductors, integrated with or deposited on a substrate by a series of compatible processes. The auxiliary devices may operate at voltages above a breakdown voltage of the transistors contained within the integrated circuit. As the operating voltages applied to the transistors increase, the transistors will eventually breakdown allowing an uncontrollable increase in current. Examples of the detrimental effects of breakdown may include punch-through, avalanche breakdown, and gate oxide breakdown to provide some examples. Furthermore, operating above the breakdown voltage for a significant duration reduces the lifetime of the transistors.

BRIEF DESCRIPTION OF THE DRAWINGS

The disclosed method and apparatus may be better understood with reference to the following drawings and description. In the figures, like reference numerals designate corresponding parts throughout the different views.

DETAILED DESCRIPTION

Figure 1:
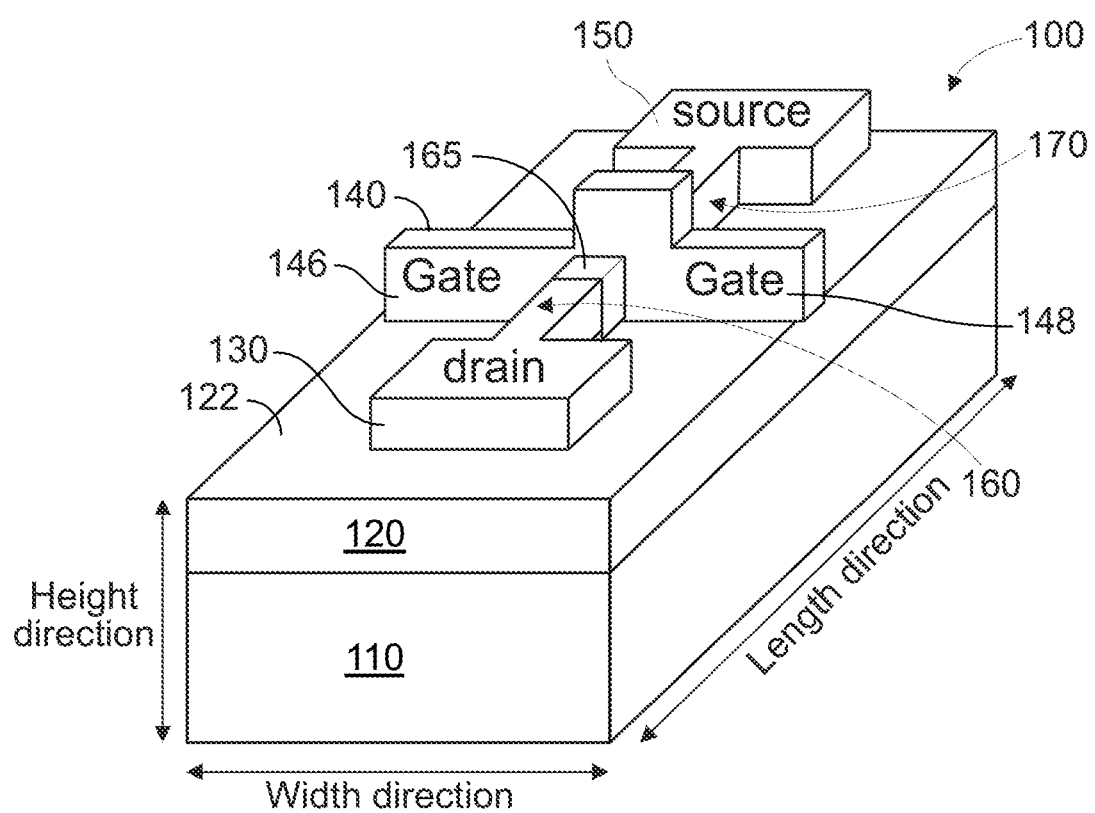
FIG. 1 shows a three-dimensional view of a semiconductor device according to a first exemplary embodiment.
Figure 2:
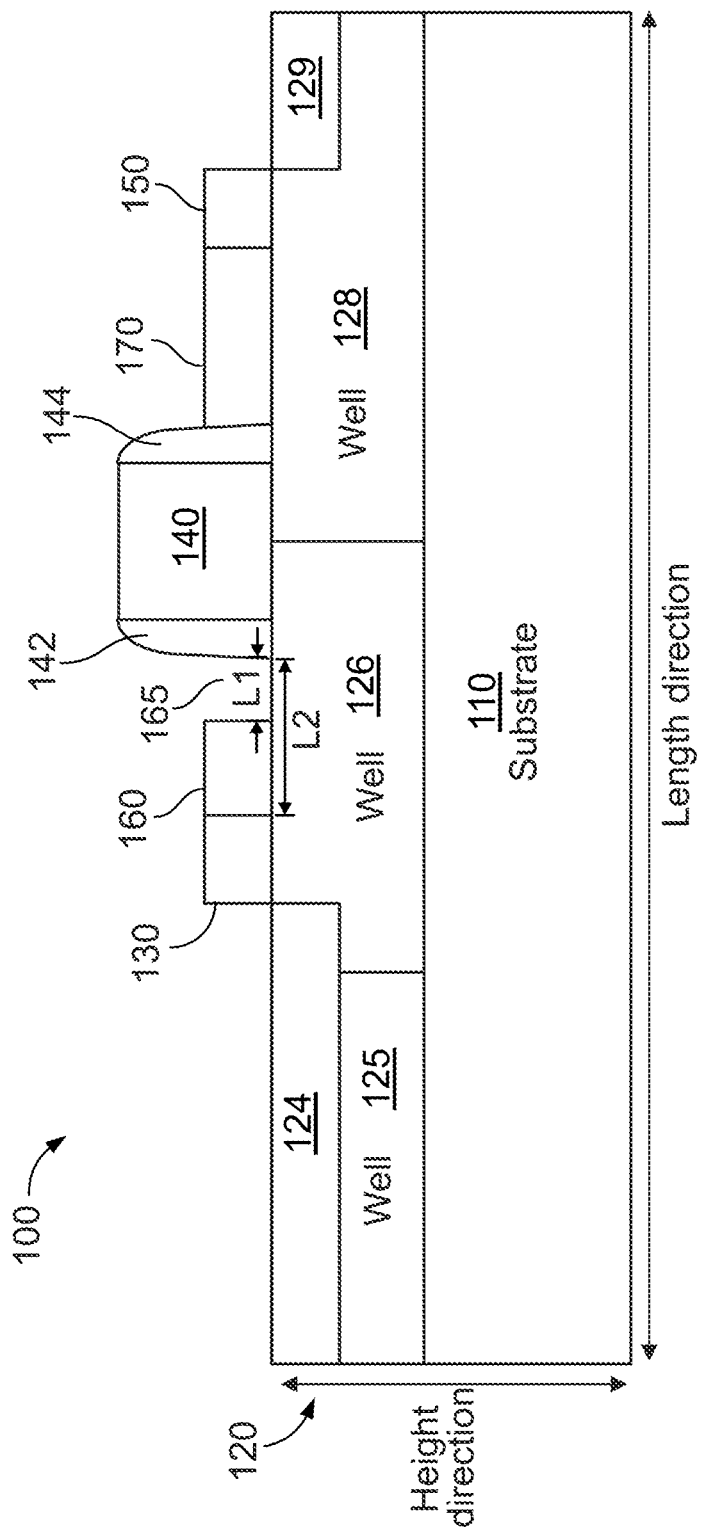
FIG. 2 shows a cross-sectional view of the semiconductor device according to the first exemplary embodiment.

FIG. 1 shows a three-dimensional view of a semiconductor device 100 according to a first exemplary embodiment. FIG. 2 shows a cross-sectional view of the semiconductor device 100 according to the first exemplary embodiment. For example, the semiconductor device 100 may be an n-type metal oxide semiconductor (NMOS) structure or a p-type metal oxide semiconductor (PMOS) structure. The semiconductor device 100 includes a semiconductor layer 120 implanted in a semiconductor substrate 110. The semiconductor layer 120 has a top surface 122. The semiconductor layer 120 may include wells and shallow trench isolation (STI) regions. For example, in FIG. 2, the semiconductor layer 120 includes a first well 128, a second well 126, and third well 125 implanted in the substrate 110.

In an embodiment, the semiconductor substrate 110 is a p-type substrate made of p-type material. The p-type material may be obtained by a doping process by adding a certain type of atoms to the semiconductor in order to increase the number of positive carriers (holes). Alternatively, the semiconductor substrate 110 may be an n-type substrate. The first well 128 may be formed by implanting a first material having a first conductivity type. The second well 126 may be formed by implanting a second material having a second conductivity type into the substrate 110. The third well 125 may be formed by implanting a first material having a first conductivity type into the substrate 110. The first material may be a p-type material such as boron or other suitable materials. The second material may be an n-type material such as phosphorous, arsenic, or other suitable materials. Alternatively, the first material may be an n-type material and the first material may be a p-type material.

The semiconductor device 100 includes a gate structure 140 between a source structure 150 and a drain structure 130. The gate structure 140 is disposed above the first well 128 and the second well 126. The gate structure 140 is located between two spacers 142 and 144 in the cross-sectional view in FIG. 2. The spacers are typically a dielectric material, such as $SiO_2$, though any suitable material can be used.

As shown in FIG. 1, the gate structure 140 includes a first gate 146 and a second gate 148. The gate structure 140 may have a same width as the semiconductor layer 120. The gate structure 140 is wider than the source structure 150 or the drain structure 130.

The raised source structure 150 is disposed above and in contact with the first well 128 as shown in FIG. 2. The raised source structure 150 is connected with the gate structure 140 through a first semiconductor fin structure 170 as shown in FIGS. 1 and 2. In an NMOS, the raised source structure 150 may include an N+ region 141 and an N-LDD region. LDD refers to lightly doped drain (LDD) that has a lighter carrier concentration than a highly doped drain (HDD) that may be designated by a "+." An LDD region may be designated by a "−" following a letter "N" or "P", which indicate a n-type material or a p-type material. Thus, the N-LDD region generally has a lighter concentration of n-type material than N+ region. The N-LDD region may have a concentration of n-type material in the ranges of $1\times10^{17}$ cm$^{-3}$ to $5\times10^{17}$ cm$^{-3}$. The first well 128 may have a concentration of p-type material in the ranges of $5\times10^{16}$ cm$^{-3}$ to $1\times10^{18}$ cm$^{-3}$.

The raised drain structure 130 is disposed above and in contact with the second well 126 as shown in FIG. 2. The fin structure 160 extends into the raised drain structure, which is formed by the epitaxial growth using 160 as a seed. The raised structure can include at least one of the materials such as n-type dopants and SiC. So the raised drain structure 130 is connected with a second semiconductor fin structure 160 as shown in FIGS. 1 and 2. The shape of the selective epitaxial growth is not limited to the shape shown in FIG. 1. The second semiconductor fin structure 160 includes a gap 165 that separates the gate structure 140 from the raised drain structure 130. The gap 165 may be formed before the gate structure 140 has been formed. The gap 165 may have a length L1 less than or equal to the length L2 of the second semiconductor fin structure 160 so that the drain structure 130 is separated from the gate structure 140 to improve the breakdown voltage of the semiconductor device 100. For example, the gap 165 may have a length L1 between 60 nm and 200 nm while the second semiconductor fin structure 160 may have a length between 0 nm and 100 nm.

The gap 165 may be located near the gate structure 140 as shown in FIGS. 1 and 2. Alternatively, the gap 165 may be located near the middle of the second semiconductor fin structure 160. The gap 165 may have uniform length or non-uniform length in the cross-sectional view. For example, the gap 165 may have a greater length away from the second well 126 and a shorter length near the second well 126.

The semiconductor layer 120 further includes a first shallow trench isolation (STI) region 124 and a second STI region 129. The STI 124 is on the third well 125 and the STI 129 is on the first well 128. The STI regions 124 and 129 may include a dielectric material, such as $SiO_2$ or other suitable material. The STI regions 124 and 129 can provide isolation and protection for the semiconductor device 100.

Figure 3:
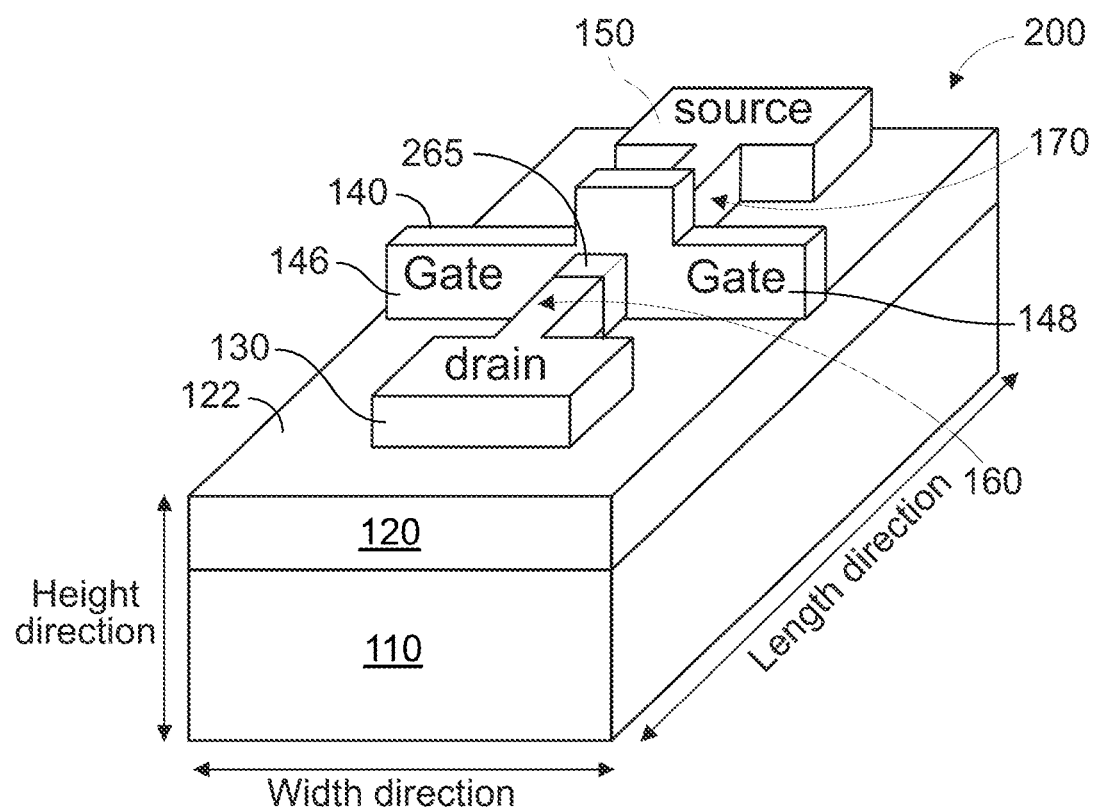
FIG. 3 shows a three-dimensional view of semiconductor device according to a second exemplary embodiment.
Figure 4:
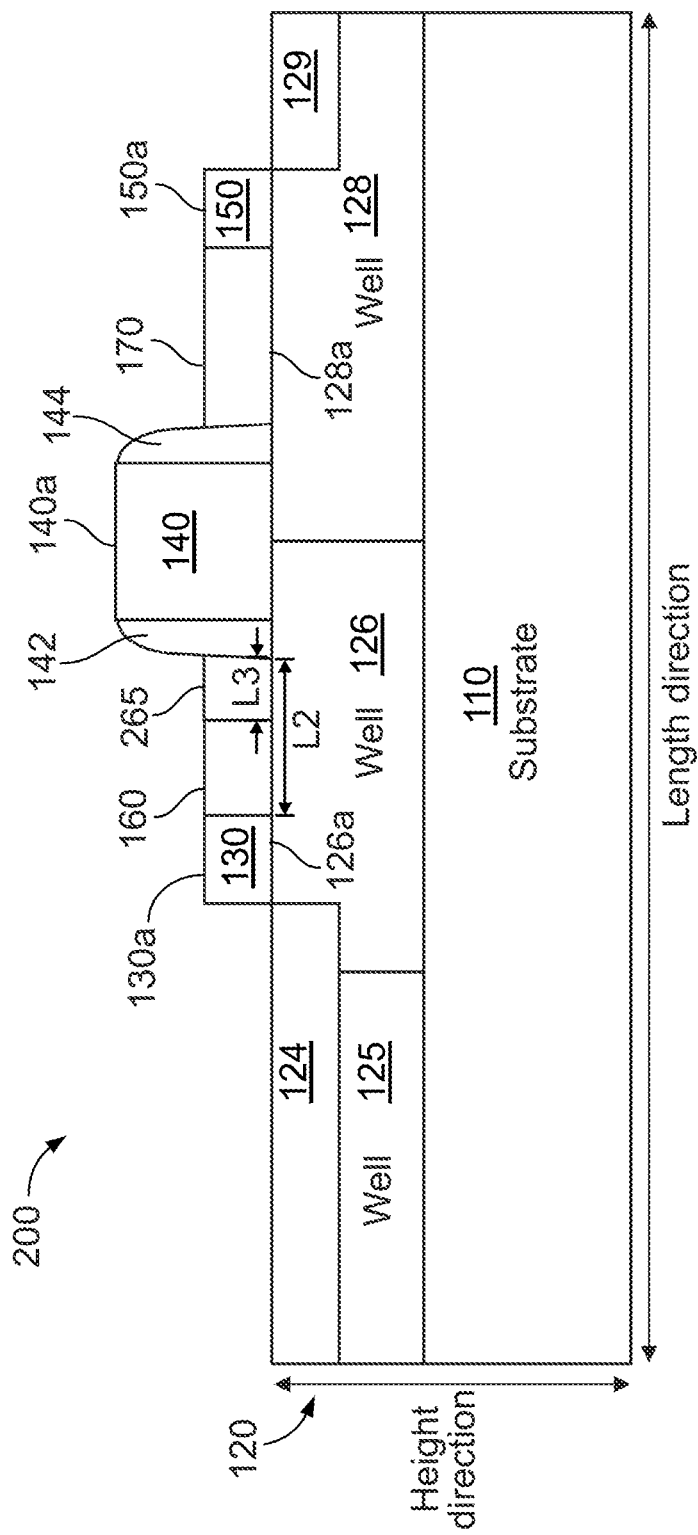
FIG. 4 shows a cross-sectional view of the semiconductor structure according to the second exemplary embodiment.

FIGS. 3-4 show a semiconductor device 200 according to a second exemplary embodiment. FIG. 3 shows a three-dimensional view of the semiconductor device 200. FIG. 4 shows a cross-sectional view of the semiconductor structure 200.

As shown in FIGS. 3-4, the first well 128 has a first well upper surface 128a and the second well 126 has a second well upper surface 126a. The raised source structure 150 is disposed above and in contact with the first well 128 having a source upper surface 150a higher in at least one location than the first well upper surface 128a and connected with the gate structure 140 through a first semiconductor fin structure 170. The raised drain structure 130 disposed on the second well 126 and connected with the gate structure 140 through a second semiconductor fin structure 160. The first semiconductor fin structure 170 and the second semiconductor fin structure 160 are doped differently. For example, the second semiconductor fin structure 160 includes a lightly doped portion 265 that is doped relatively lighter than the first semiconductor fin structure 170. In another example, the second semiconductor fin structure 160 may include a none doped portion 265. The lightly doped portion 265 may be close to the gate structure 140 or close to the drain structure 130. Alternatively, the gap 165 may be located near the middle of the second semiconductor fin structure 160. The lightly doped portion 265 may have dimensions similar to the dimensions of the gap 165 in FIGS. 1-2. Similarly, the lightly doped portion 265 may have uniform length or non-uniform length in the cross-sectional view. For example, the lightly doped portion 265 may have a greater length away from the second well 126 and a shorter length near the second well 126.

The doping density of the second semiconductor fin structure 160 may be different from the doping density of the first semiconductor fin structure 170. For example, the doping density of the first semiconductor fin structure 170 is in the range of about $1\times10^{19}$ $cm^{-3}$ to $1\times10^{21}$ $cm^{-3}$. The doping density of the second semiconductor fin structure 160 is in the range of about $1\times10^{19}$ $cm^{-3}$ to $1\times10^{21}$ $cm^{-3}$.

Alternatively, the second semiconductor fin structure 160 and the first semiconductor fin structure 170 may be doped using material with different conductivity. For example, the material of the first semiconductor fin structure 170 may include: As. The material of the second semiconductor fin structure 160 may include Ph.

As shown in FIGS. 3-4, the first and second semiconductor fin structures 170 and 160 both have narrower widths than the gate structure 140. The gate structure 140 has a gate upper surface 140a higher than the source upper surface 150a and the drain upper surface 130a.

As shown in FIG. 3, the first semiconductor fin structure 170 has a narrower width than the raised source structure 150. The second semiconductor fin structure 160 has a narrower width than the raised drain structure 130.

Figure 5:
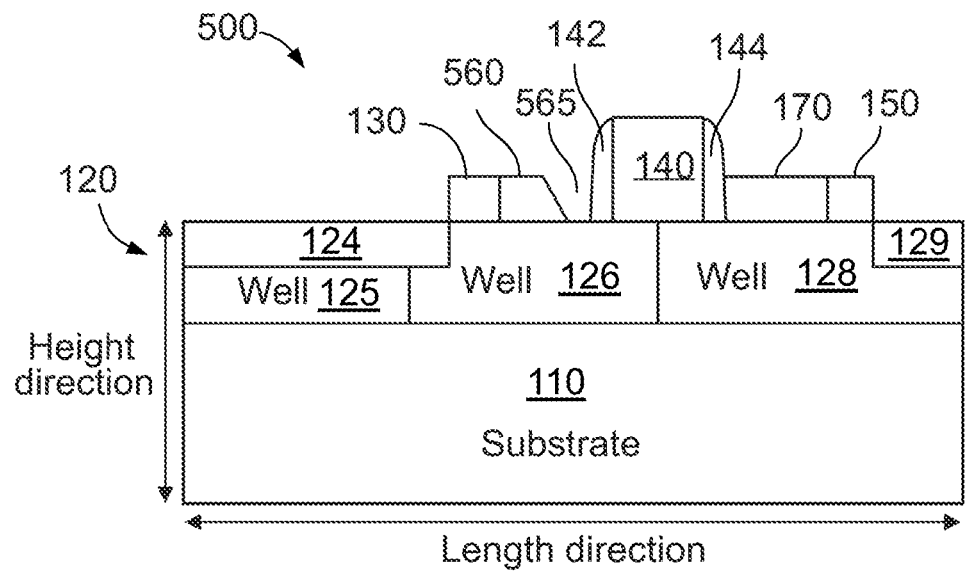
FIG. 5 shows a cross-sectional view of a semiconductor structure according to a third exemplary embodiment.

FIG. 5 shows a cross-sectional view of a semiconductor structure 500 according to a third exemplary embodiment. One of the differences between the third exemplary embodiment and the first exemplary embodiment is that the gap 565 of the second semiconductor fin structure 560 has a different shape. The gap 565 may has a trapezoid shape that has a larger upper opening and a smaller bottom opening. The gap 565 may have other shapes with non-uniform lengths at the upper opening and the bottom opening.

Figure 6:
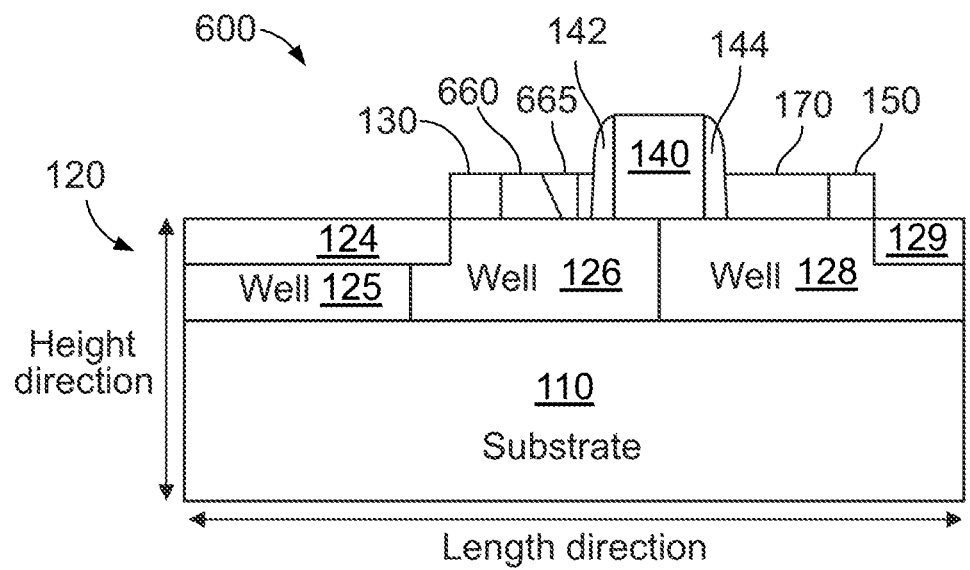
FIG. 6 shows a cross-sectional view of a semiconductor structure according to a fourth exemplary embodiment.

FIG. 6 shows a cross-sectional view of a semiconductor structure 600 according to a fourth exemplary embodiment. One of the differences between the fourth exemplary embodiment and the second exemplary embodiment is that the lightly doped portion 665 of the second semiconductor fin structure 660 has a different shape. The lightly doped portion 665 may has a trapezoid shape that has a larger upper opening and a smaller bottom opening. The lightly doped portion 665 may be located near the middle of the second semiconductor fin structure 660. Similarly, the lightly doped portion 665 may have other shapes with non-uniform lengths along the height of the lightly doped portion 665.

Figure 7:
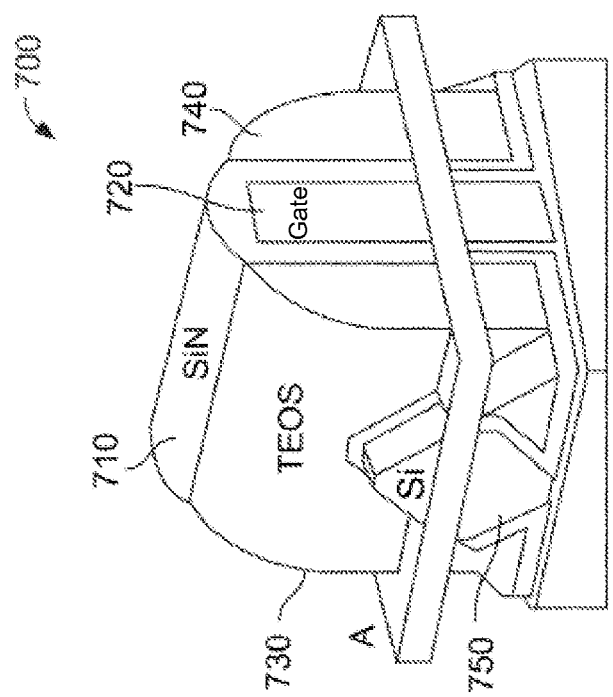
FIG. 7(a) shows a three-dimensional view of a semiconductor device according to a fifth exemplary embodiment.
FIG. 7(b) shows a cross-sectional view of the semiconductor device according to a fifth exemplary embodiment.
Figure 7:
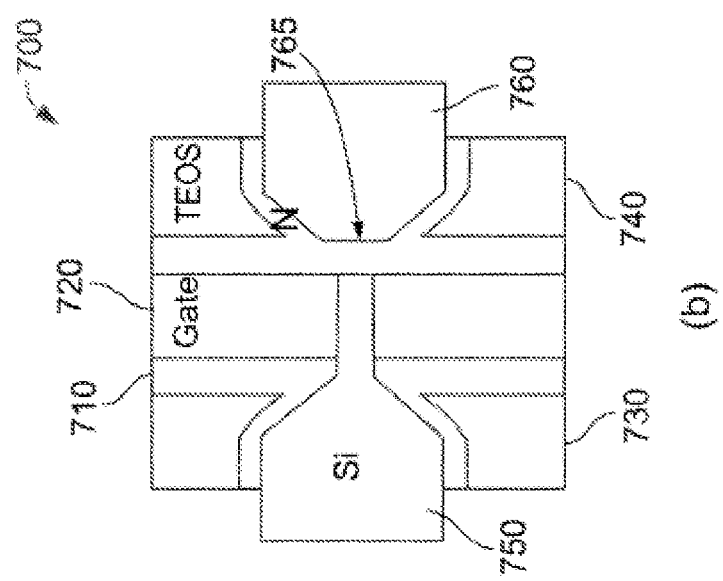

FIG. 7(a) shows a three-dimensional view of a semiconductor device 700 according to a fifth exemplary embodiment. The semiconductor device 700 includes a gate structure 720 with double spacers that include a silicon nitride portion 710 and oxide or tetraethyl orthosilicate (TEOS) portions 730, 740. The in situ doped raised source structure 750 and drain structure 760 are deposited by an epitaxial process in order to have a low contact resistance. The gap 765 or lightly doped fin may be located near the gate 720 to enhance the breakdown voltage. The lightly doped fin may include fin material may include Si, SiGe, or Ge.

FIG. 7(b) shows a cross-sectional view of the semiconductor device 700 along the plane A according to the fifth exemplary embodiment in FIG. 7(a). The source structure 750 and the drain structure 760 both include a rectangular portion and a trapezoid portion. The trapezoid portions are relatively close to the gate structure 720 compared to the rectangular portions.

Figure 8:
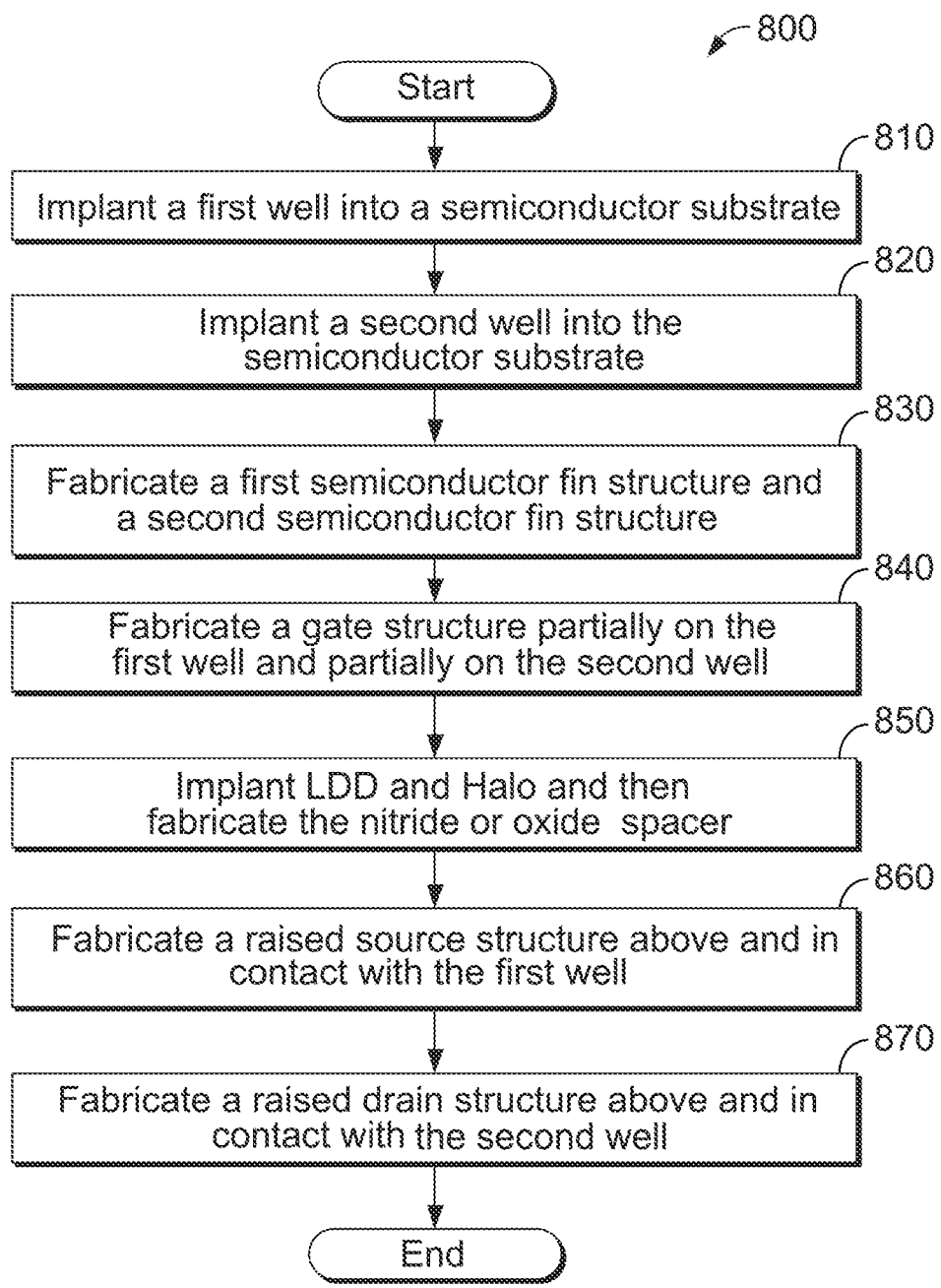
FIG. 8 shows an exemplary method to manufacture a semiconductor device.

FIG. 8 shows an exemplary fabrication process 800 for fabricating a semiconductor device with increased breakdown voltage. The method 800 is for illustration only, and the processes described below do not have to be carried out in the described order. Also, other fabrication steps may be introduced.

In the fabrication process 800, a first well is fabricated by implanting the first well into a semiconductor substrate (810). This step may include implanting a semiconductor substrate with an appropriate impurity to form a P-well or an N-well. For example, implanting the substrate with boron, a p-type material, forms the P-well, while implanting the substrate with phosphorous or arsenic, both n-type materials, forms the N-well.

A second well is fabricated by implanting a semiconductor substrate into the semiconductor substrate (820). This step may include implanting a semiconductor substrate with an appropriate impurity to form a P-well or an N-well. The first well and the second wells have different conductivity types.

For example, the second well may be an N-well when the first well is a P-well. The second well may be a P-well when the first well is an N-well.

A first fin structure and a second fin structure may be fabricated by the conventional photoresist process and etch and also by the spacers (830). For example, the first semiconductor fin structure may be fabricated by depositing semiconductor regions between the source structure and the gate structure. The second fin structure is fabricated differently from the first fin structure. For example, the second semiconductor fin structure may be disposed between a gate structure and a raised drain structure and have a gap separating the gate structure from the raised drain structure. The second semiconductor fin structure may connect the gate structure and the raised drain structure and is doped differently from the first fin structure. The second semiconductor fin structure may be undoped or doped relatively lighter than the first semiconductor fin structure.

A gate structure is formed by fabricating at least one semiconductor substrate partially on the first well and partially on the second well (840). This step may include implanting a semiconductor substrate with polycrystalline silicon, though any suitable material can be used, on top of a gate oxide to form the gate structure. The gate structure may include multiple gates. Lightly implanting the polycrystalline silicon with the appropriate impurity increases the breakdown voltage of the transistor. Lightly implanting n-type material into the polycrystalline silicon to form an N-region creates the gate of an NMOS device, while lightly implanting p-type material polycrystalline silicon to form a P-region creates the gate of a PMOS device. In exemplary embodiment, the gate is lightly implanted on the order of $10^{18}$ cm$^{-3}$.

A spacer is fabricated by depositing a dielectric material such as $SiO_2$ on top of a semiconductor substrate to form spacers after an LDD and HALO are implanted (850). This may include fabricating a spacer on a side of polysilicon or dummy polysilicon of the gate structure after implanting an LDD partially under the gate structure. Two spacers may be fabricated adjacent to the gate structure.

A raised source structure is fabricated by implanting a source semiconductor layer at least partially above the first well and in contact with the first well (860). This step may include implanting an LDD region in the first well and fabricating a HDD region on the LDD region by growing an epitaxial silicon layer. Alternatively, this step may include implanting a HDD region after recessing a source region on the LDD region. The implanted HDD region then is partially in the first well and the formed source upper surface is above the first well surface as illustrated in FIGS. 1-6. This step may further include implanting a silicide layer on the HDD region.

A raised drain structure is fabricated by implanting a drain semiconductor region in the second well (870). This step may include fabricating a HDD region above and in contact with the second well and separate from the gate structure. This step may further include implanting a silicide layer on the HDD region. The fabricated drain structure includes a drain connection point above the surface of the second well. The fabricated drain structure includes a drain connection point above the surface of the second well as illustrated in FIGS. 1-6.

The first semiconductor fin structure connects the gate structure and the raised source. The step may include depositing a semiconductor material similar to the material in the source structure above the semiconductor layer 120 in FIGS. 1-6. The fin material may include Si, SiGe, and Ge. The first semiconductor fin structure has a narrower width than the raised source structure. The second semiconductor fin structure is disposed between the gate structure and the raised drain structure. The second semiconductor fin structure comprise at least one of the following: a gap separating the gate structure from the raised drain structure; and a lightly doped region that is doped relatively lighter than the first semiconductor fin structure.

The formed second semiconductor fin structure has a narrower width than the raised drain structure. The second semiconductor fin structure may be doped relatively lighter than the first semiconductor fin structure to increase the break down voltage of the semiconductor device.

The method may further includes forming a silicide layer that includes depositing metal on top of poly silicon and then alloy to create silicide, though any suitable material can be used, on top of the gate, the source, and the drain of a transistor to form the connection between the fabricated transistor and a metallization layer. The metallization layer forms the interconnections between the fabricated transistor and other devices. The region of the semiconductor substrate in between the gate and the drain may lack silicide. In other words, there is a gap in the silicide layer between the gate and the drain, requiring the removal of any silicide in this region.

The methods, devices, and logic described above may be implemented in many different ways in many different combinations of hardware. For example, all or parts of the devices may be included in a phone, a laptop, a circuitry, a controller, a microprocessor, or an application specific integrated circuit (ASIC), or may be implemented with discrete logic or components, or a combination of other types of analog or digital circuitry, combined on a single integrated circuit or distributed among multiple integrated circuits.

The embodiments disclose are for illustrative purposes only, and are not limiting. Many other embodiments and implementations are possible within the scope of the systems and methods. Accordingly, the devices and methods are not to be restricted except in light of the attached claims and their equivalents.

What is claimed is:

1. A semiconductor device, comprising:
    a first well implanted in a semiconductor substrate;
    a second well implanted in the semiconductor substrate;
    a gate structure above the first and second wells;
    a raised source structure above and in contact with the first well and connected with the gate structure through a first semiconductor fin structure; and
    a raised drain structure above and in contact with the second well and connected with a second semiconductor fin structure,
    wherein the second semiconductor fin structure defines a gap along the second semiconductor fin structure that separates the second semiconductor fin structure from the raised drain structure.

2. The semiconductor device of claim 1, wherein the first and second semiconductor fin structures have narrower widths than the gate structure.

3. The semiconductor device of claim 1, wherein the first semiconductor fin structure has a narrower width than the raised source structure.

4. The semiconductor device of claim 1, wherein the second semiconductor fin structure has a narrower width than the raised drain structure.

5. The semiconductor device of claim 1, wherein both the raised source structure and the raised drain structure have narrower widths than the gate structure.

6. The semiconductor device of claim 1, wherein the gate structure comprises a plurality of gates.

7. The semiconductor device of claim 1, wherein the gap has a gap length less than a fin length of the second semiconductor fin structure.

8. The semiconductor device of claim 1, wherein the gap has a non-uniform gap length.

9. A semiconductor device, comprising:
a first well having a first well upper surface;
a second well having a second well upper surface;
a gate structure disposed on the first well upper surface and the second well upper surface;
a raised source structure disposed above and in contact with the first well having a source upper surface higher in at least one location than the first well upper surface and connected with the gate structure through a first semiconductor fin structure; and
a raised drain structure disposed on the second well and connected with the gate structure through a second semiconductor fin structure, wherein the second semiconductor fin structure is doped relatively lighter than the first semiconductor fin structure.

10. The semiconductor device of claim 9, wherein the first and second semiconductor fin structures have narrower widths than the gate structure.

11. The semiconductor device of claim 10, wherein the gate structure has a gate upper surface higher than the source and drain upper surfaces.

12. The semiconductor device of claim 10, wherein the gate structure comprises a plurality of gates.

13. The semiconductor device of claim 12, wherein the first semiconductor fin structure has a narrower width than the raised source structure.

14. The semiconductor device of claim 13, wherein the second semiconductor fin structure has a narrower width than the raised drain structure.

15. The semiconductor device of claim 14, wherein the second semiconductor fin structure comprises a lightly doped portion compared with the first semiconductor fin structure, the lightly doped portion has a length less than a fin length of the second semiconductor fin structure.

16. The semiconductor device of claim 15, wherein the lightly doped portion has a non-uniform length.

17. A semiconductor device, comprising:
a first well implanted into a semiconductor substrate;
a second well implanted into the semiconductor substrate;
a gate structure partially on the first well and partially on the second well;
a first semiconductor fin structure disposed on a first side of the gate structure and a second semiconductor fin structure disposed on a second side of the gate structure;
a raised source structure above and in contact with the first well; and
a raised drain structure above and in contact with the second well,
wherein:
the first semiconductor fin structure connects the gate structure and the raised source structure;
the second semiconductor fin structure is disposed between the gate structure and the raised drain structure; and
the second semiconductor fin structure comprises:
a gap separating the gate structure from the raised drain structure;
a lightly doped region that is doped relatively lighter than the first semiconductor fin structure, or both.

18. The semiconductor device of claim 17, wherein the first and second semiconductor fin structures have narrower widths than the gate structure.

19. The semiconductor device of claim 17, wherein:
the first semiconductor fin structure has a narrower width than the raised source structure; and
the second semiconductor fin structure has a narrower width than the raised drain structure.

20. The semiconductor device of claim 19, wherein the second semiconductor fin structure is doped relatively lighter than the first semiconductor fin structure.

* * * * *